United States Patent
Komatsu et al.

(10) Patent No.: US 9,991,097 B2
(45) Date of Patent: Jun. 5, 2018

(54) PLASMA PROCESSING APPARATUS

(71) Applicant: TOKYO ELECTRON LIMITED, Tokyo (JP)

(72) Inventors: Tomohito Komatsu, Yamanashi (JP); Shigenori Ozaki, Yamanashi (JP); Yutaka Fujino, Yamanashi (JP); Jun Nakagomi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days. days.

(21) Appl. No.: 15/793,856

(22) Filed: Oct. 25, 2017

(65) Prior Publication Data

US 2018/0114677 A1 Apr. 26, 2018

(30) Foreign Application Priority Data

Oct. 25, 2016 (JP) .................................. 2016-208443

(51) Int. Cl.
*H01J 37/32* (2006.01)

(52) U.S. Cl.
CPC .. *H01J 37/32201* (2013.01); *H01J 37/32302* (2013.01)

(58) Field of Classification Search
CPC ........ C23C 16/45563; C23C 16/45565; C23C 16/45589; C23C 16/45574; H01J 37/32431; H01J 37/3244; H01J 37/32449; H01J 37/32192; H01J 37/32211; H01J 37/32238; H01J 37/32201; C30B 25/14
See application file for complete search history.

(56) References Cited

U.S. PATENT DOCUMENTS

| 6,110,543 A * | 8/2000 | DeSantolo ............ C23C 16/345 427/255.23 |
| 6,399,520 B1 | 6/2002 | Kawakami et al. |
| 6,872,259 B2 * | 3/2005 | Strang ............... C23C 16/45565 118/715 |
| 7,252,716 B2 * | 8/2007 | Kim ..................... C23C 16/4558 118/715 |
| 2009/0159214 A1 | 6/2009 | Kasai |
| 2009/0311869 A1 | 12/2009 | Okesaku et al. |
| 2012/0247675 A1 | 10/2012 | Ikeda et al. |

FOREIGN PATENT DOCUMENTS

| JP | 2000-294550 A | 10/2000 |
| JP | 2008-047883 A | 2/2008 |
| JP | 2012-216525 A | 11/2012 |
| WO | 2008/013112 A1 | 1/2008 |

* cited by examiner

Primary Examiner — Haissa Philogene (57) ABSTRACT

A plasma processing apparatus includes a chamber; a mounting table configured to mount thereon a target object in the chamber; a plasma source configured to introduce microwaves into the chamber through a ceiling wall of the chamber and generate a surface wave plasma in the chamber; a first gas introduction unit configured to introduce a first gas into the chamber from the ceiling wall; and a second gas introduction unit configured to introduce a second gas into the chamber from a predetermined height position between the ceiling wall and the mounting table. The second gas introduction unit has a plurality of nozzles extending from the ceiling wall toward the mounting table and arranged on a same circumference at a regular interval. Each of the nozzles discharges the second gas toward a nozzle adjacent thereto.

6 Claims, 8 Drawing Sheets

PLASMA PROCESSING APPARATUS

CROSS-REFERENCE TO RELATED APPLICATIONS

This application claims priority to Japanese Patent Application No. 2016-208443 filed on Oct. 25, 2016, the entire contents of which are incorporated herein by reference.

FIELD OF THE INVENTION

The disclosure relates to a plasma processing apparatus for performing plasma processing on a target object such as a semiconductor wafer or the like.

BACKGROUND OF THE INVENTION

Plasma processing is a technique that is necessary to manufacture semiconductor devices. Recently, due to demands for high-integration and high-speed of LSI (Large Scale Integrated circuit), a design rule of the semiconductor devices constituting the LSI is further miniaturized, and a semiconductor wafer is scaled up. Accordingly, a plasma processing apparatus needs to cope with such miniaturization and scaling up.

As for the plasma processing apparatus, a parallel plate type plasma processing apparatus or an inductively coupled plasma processing apparatus has been conventionally used. In that case, however, a generated plasma has a high electron temperature and, thus, fine devices are damaged.

Further, since a region having a high plasma density is limited, it is difficult for the parallel plate type plasma processing apparatus or the inductively coupled plasma processing apparatus to uniformly and quickly perform plasma processing on a scaled-up semiconductor wafer.

Accordingly, an RLSA (registered trademark) microwave plasma processing apparatus capable of uniformly generating a surface wave plasma having a high density and a low electron temperature attracts attention (see, e.g., Japanese Patent Application Publication No. 2000-294550).

In the RLSA microwave plasma processing apparatus, a planar slot antenna having a plurality of slots formed in a predetermined pattern is provided, as a microwave radiating antenna for radiating a microwave for generating a surface wave plasma, at an upper portion of a chamber. A microwave generated from a microwave generation source is radiated from the slots of the antenna into the chamber maintained in a vacuum state through a microwave transmission plate that is made of a dielectric material and forms a ceiling wall of the chamber. A surface wave plasma is generated in the chamber by a microwave magnetic field. Accordingly, a target object such as a semiconductor wafer or the like is processed.

Meanwhile, PCT Publication No. 2008/013112 discloses a plasma source for dividing a microwave into a plurality of microwaves, guiding microwaves radiated from a plurality of microwave radiation mechanisms provided at a top surface of the chamber into a chamber and spatially combining a plasma in the chamber, each of the microwave radiation mechanisms having the above-described planar antenna and a tuner for matching an impedance. By spatially combining the plasma by using the plurality of microwave radiation mechanisms, it is possible to individually control phases and intensities of the microwaves introduced from the microwave radiation mechanism and also possible to relatively easily control plasma distribution.

In the apparatuses disclosed in Japanese Patent Application Publication No. 2000-294550 and PCT Publication No. 2008/013112, a processing gas and an excitation gas such as Ar gas are supplied from a sidewall of the chamber into the chamber during plasma processing. Therefore, the controllability of flow of the processing gas or the excitation gas in the chamber is poor and it is difficult to uniformly introduce the processing gas or the excitation gas. As a solution to such problems, Japanese Patent Application Publication No. 2012-216525 discloses a technique for introducing a gas from a ceiling wall of the chamber.

When the excitation gas and the processing gas are introduced into the chamber, an appropriate dissociation state suitable for properties of gases is required. For example, in the case of forming a SiN film by plasma CVD using $SiH_4$ gas as a processing gas and a nitriding gas such as $N_2$ gas, $NH_3$ gas or the like, Ar gas or the nitriding gas such as $N_2$ gas, $NH_3$ gas or the like requires energy that is enough for excitation and dissociation, whereas excessive dissociation of the $SiH_4$ gas needs to be prevented. However, in the case of introducing gas from the ceiling wall of the chamber as disclosed in Japanese Patent Application Publication No. 2012-216525, it is not possible to prevent introduction of gas into a high electron temperature region. Thus, the gas such as $SiH_4$ gas or the like, which is not intended to be excessively dissociated, is also excessively dissociated. Accordingly, gaseous particles are generated or a nozzle is clogged.

On the other hand, Japanese Patent Application Publication No. 2008-47883 discloses a microwave plasma processing apparatus including an upper shower plate provided at a ceiling wall for introducing a microwave and a lower shower plate provided between the upper shower plate and a target substrate. An excitation gas such as Ar gas or the like or a gas to be actively dissociated is introduced from the upper shower plate. A gas which is not intended to be excessively dissociated, such as $SiH_4$ gas or the like, is introduced from the lower shower plate. In other words, the microwave plasma processing apparatus generates a surface wave plasma by introducing a microwave into a chamber from a ceiling wall. Since, however, an electron temperature of a plasma is highest at a portion directly below the ceiling wall and abruptly decreased at a plasma diffusion region spaced from the ceiling wall, a dissociation state suitable for properties of gases can be realized by utilizing a difference in the electron temperature depending on positions in the chamber.

However, in the microwave plasma processing apparatus disclosed in Japanese Patent Application Publication No. 2008-47883, the lower shower plate has a gas channel and a plurality of openings through which a plasma passes, and the processing gas is introduced from a gas supply port formed at a sidewall of the chamber. Therefore, diffusion of the plasma is disturbed by the gas supply port and the gas channel. Accordingly, in the microwave plasma processing apparatus disclosed in Japanese Patent Application Publication No. 2008-47883, a plasma density becomes insufficient, which makes it difficult to obtain a desired film forming rate or film quality controllability. In addition, the uniformity of the plasma becomes insufficient, so that desired in-plane uniformity of the plasma processing may not be obtained.

SUMMARY OF THE INVENTION

In view of the above, the disclosure provides a plasma processing apparatus capable of realizing both of processing gas introduction uniformity and desired plasma uniformity while maintaining a plasma density by dissociating a processing gas to a state suitable for properties of gases.

In accordance with an aspect, there is provided a plasma processing apparatus including: a chamber; a mounting table configured to mount thereon a target object in the chamber; a plasma source configured to introduce microwaves into the chamber through a ceiling wall of the chamber and generate a surface wave plasma in the chamber; a first gas introduction unit configured to introduce a first gas into the chamber from the ceiling wall; and a second gas introduction unit configured to introduce a second gas into the chamber from a predetermined height position between the ceiling wall and the mounting table. The second gas introduction unit has a plurality of nozzles extending from the ceiling wall toward the mounting table and arranged on a same circumference at a regular interval. Each of the nozzles discharges the second gas toward a nozzle adjacent thereto.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Hereinafter, embodiments will be described in detail with reference to the accompanying drawings. Like reference numerals will be used for like parts having substantially the same functions throughout the specification and the drawings, and redundant description thereof will be omitted. The present disclosure is not limited by the following embodiments.

First Embodiment

Figure 1:
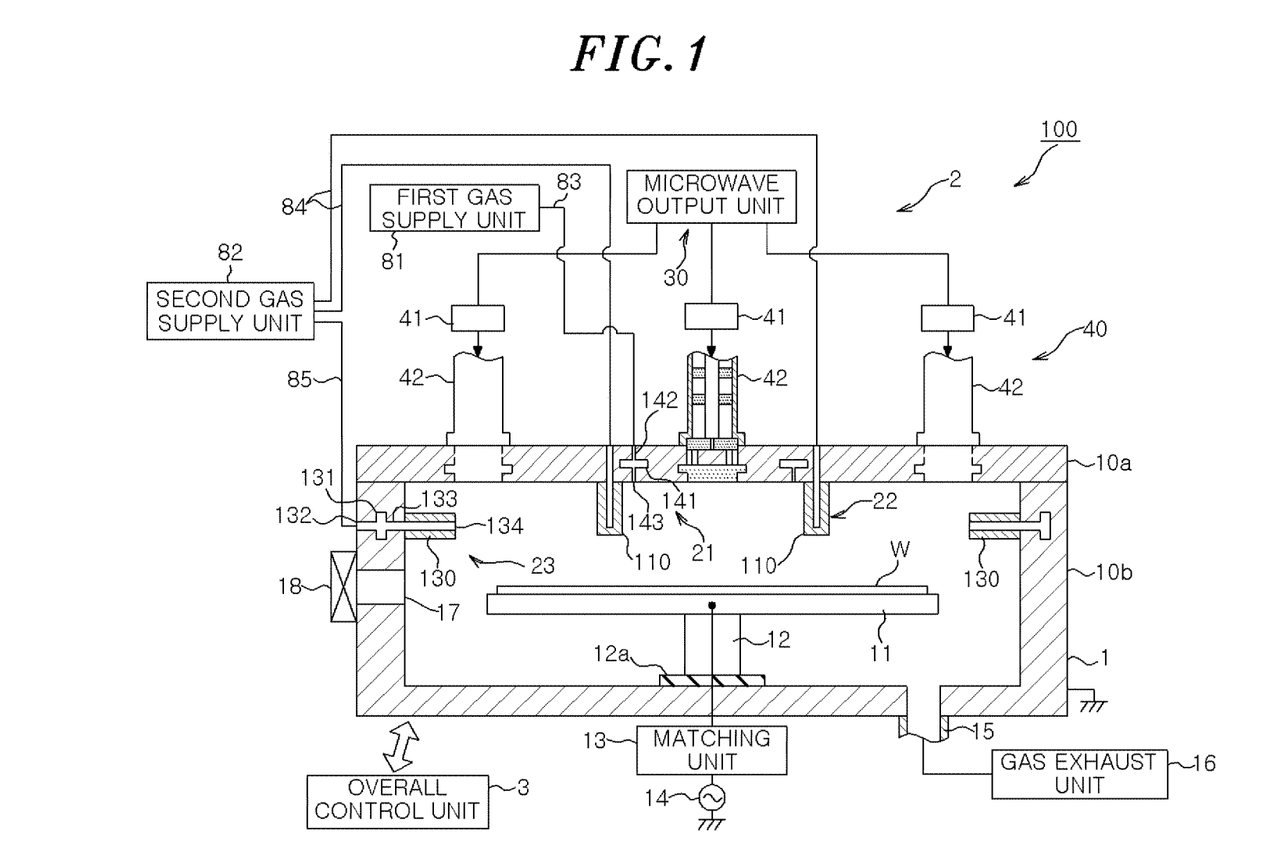
FIG. 1 is a cross sectional view showing a schematic configuration of a plasma processing apparatus according to a first embodiment.
Figure 2:
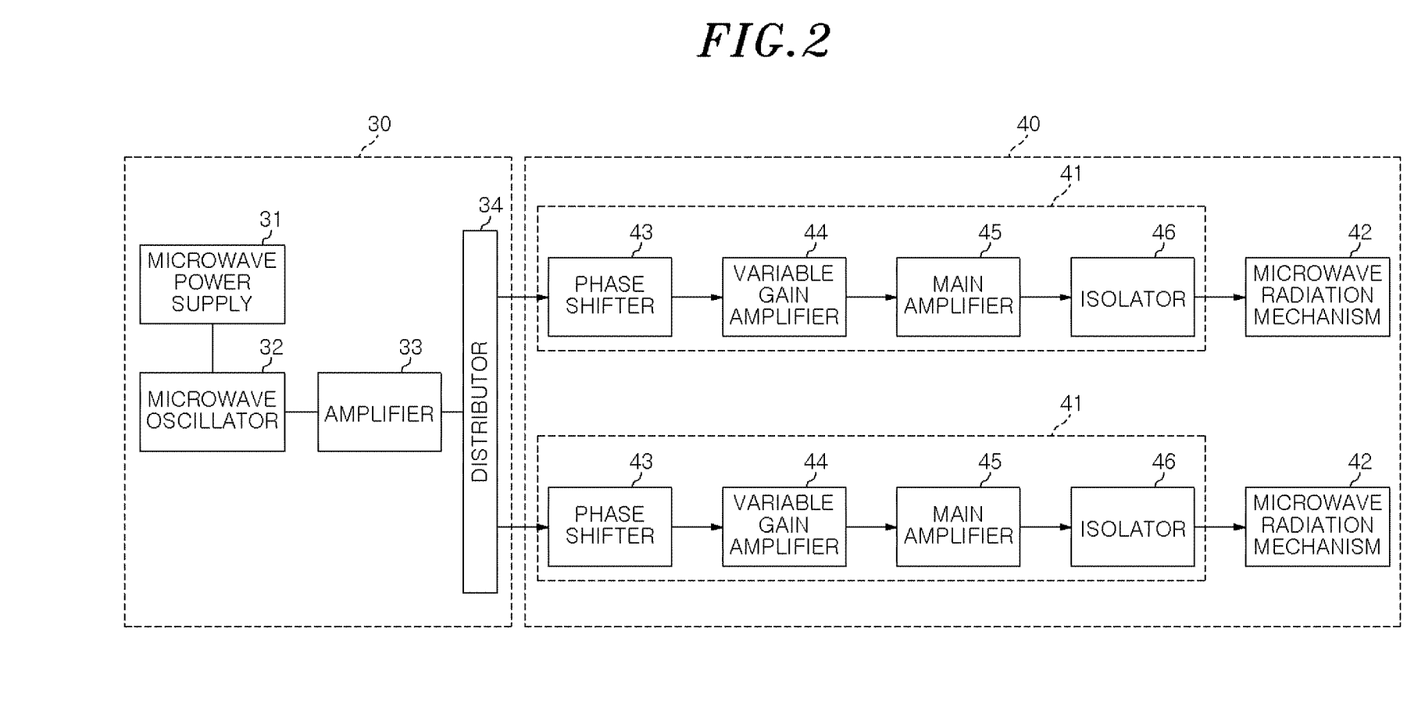
FIG. 2 is a block diagram showing a configuration of a microwave plasma source used in the plasma processing apparatus shown in FIG. 1.
Figure 3:
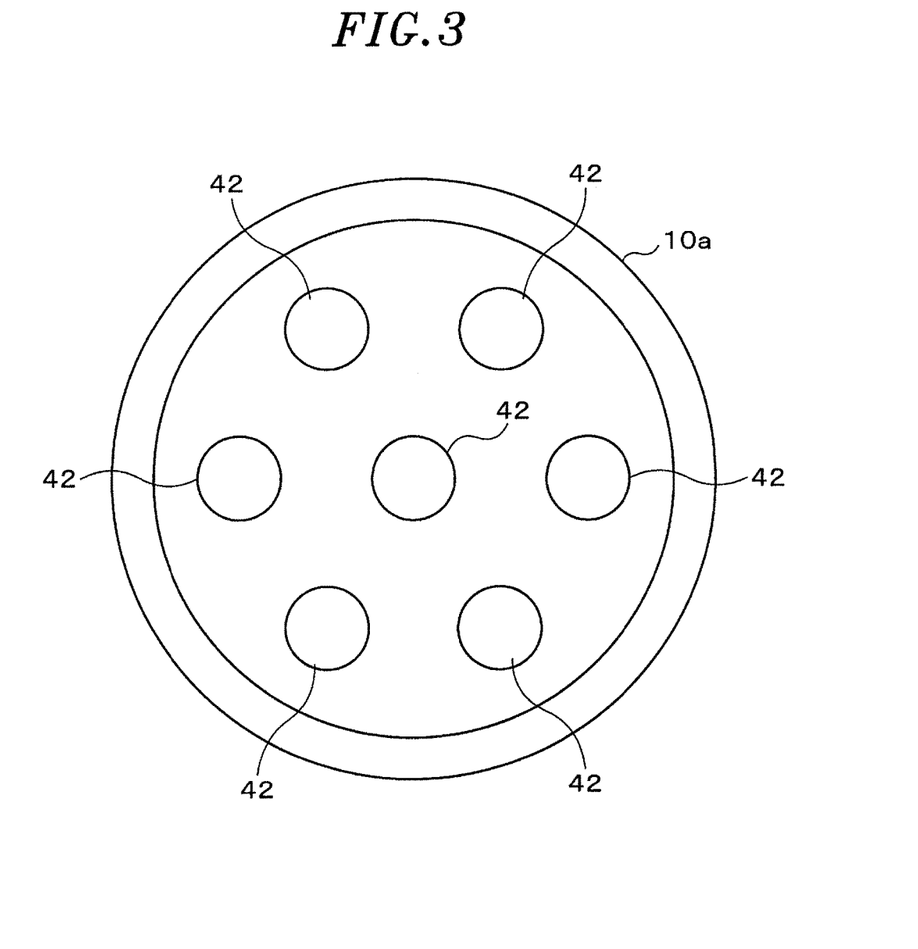
FIG. 3 shows arrangement of microwave radiation mechanisms in the microwave plasma source shown in FIG. 2.
Figure 4:
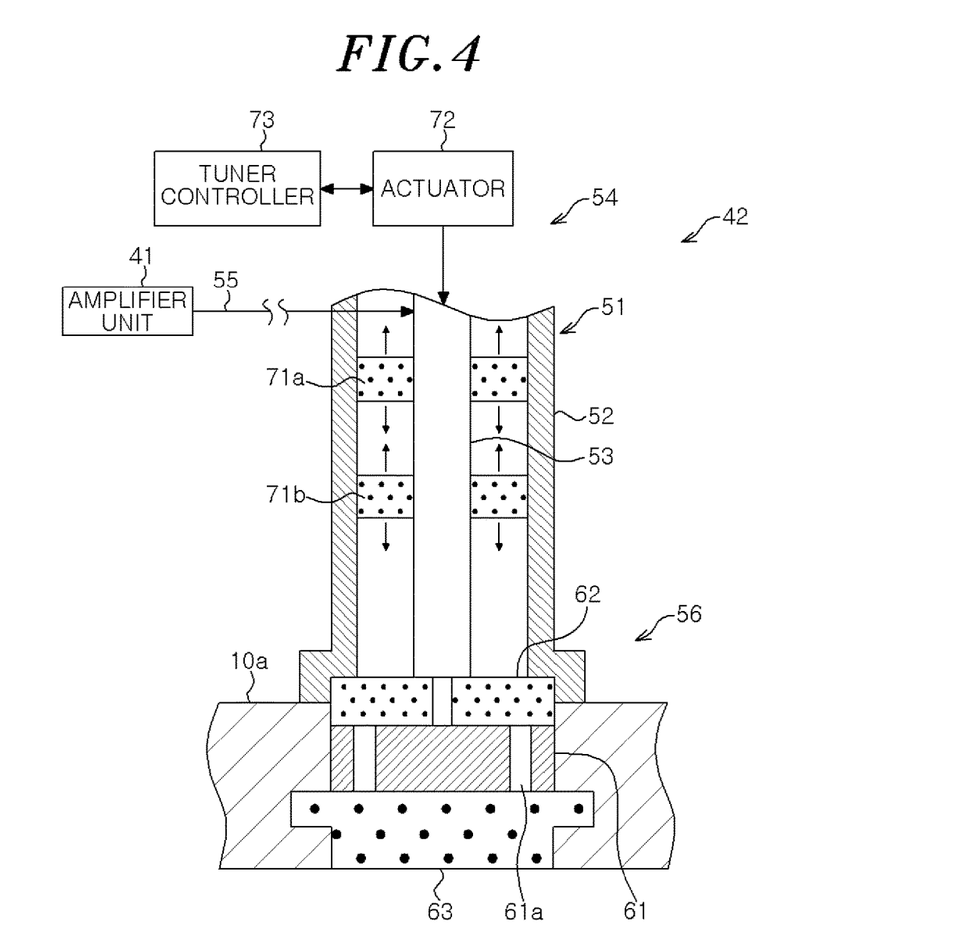
FIG. 4 is a cross sectional view showing the microwave radiation mechanism in the microwave plasma source of the plasma processing apparatus shown in FIG. 1.

FIG. 1 is a cross sectional view showing a schematic configuration of a plasma processing apparatus according to a first embodiment. FIG. 2 is a block diagram showing a configuration of a microwave plasma source used in the plasma processing apparatus shown in FIG. 1. FIG. 3 shows arrangement of microwave radiation mechanisms in the microwave plasma source shown in FIG. 2. FIG. 4 is a cross sectional view showing the microwave radiation mechanism in the microwave plasma source of the plasma processing apparatus shown in FIG. 1.

A plasma processing apparatus 100 shown in FIG. 1 performs a predetermined plasma processing on a wafer by generating a surface wave plasma by microwaves. The plasma processing may be film formation, etching or the like.

The plasma processing apparatus 100 includes a substantially cylindrical airtight chamber 1 that is grounded and made of a metal such as aluminum or the like, and a microwave plasma source 2 for generating a surface wave plasma by introducing microwaves into the chamber 1. A ceiling wall 10a of the chamber 1 is formed by fitting dielectric members of a plurality of microwave radiation mechanisms to be described later to a metallic main body. The microwave plasma source 2 is configured to introduce microwaves into the chamber 1 through a plurality of dielectric members in the ceiling wall 10a.

The plasma processing apparatus 100 further includes an overall control unit 3. The overall control unit 3 is, e.g., a computer, and has a program storage unit (not shown). In the program storage unit, a program for controlling processing of a wafer W in the plasma processing apparatus 100 is stored. Further, the program may be stored in a computer-readable storage medium, e.g., a hard disk (HD), a flexible disk (FD), a compact disk (CD), a magneto-optical disk (MO), a memory card or the like, and installed from the storage medium to the overall control unit 3.

In the chamber 1, a susceptor (mounting table) 11 for horizontally holding a semiconductor wafer W (hereinafter, referred to as "wafer W") as a target object is supported by a cylindrical supporting member 12 provided at a center of a bottom portion of the chamber 1 through an insulating member 12a. The susceptor 11 and the supporting member 12 may be made of, e.g., a metal such as aluminum having an alumite treated (anodically oxidized) surface or an insulator (ceramic or the like) having therein a high frequency electrode.

Although it is not illustrated, the susceptor 11 includes a temperature control mechanism, a gas channel for supplying a heat transfer gas to a backside of the wafer W, and elevating pins movable vertically to transfer the wafer W, and the like. Further, the susceptor 11 may include an electrostatic chuck for attracting and holding the wafer W.

A high frequency bias power supply 14 is electrically connected to the susceptor 11 via a matching unit 13. By supplying a high frequency power from the high frequency bias power supply 14 to the susceptor 11, ions in the plasma are attracted to the wafer W. The high frequency bias power supply 14 may not be provided depending on characteristics of plasma processing. In that case, no electrode is required even when an insulating member made of ceramic such as AlN or the like is used as the susceptor 11.

A gas exhaust line 15 is connected to the bottom portion of the chamber 1. A gas exhaust unit 16 including a vacuum pump is connected to the gas exhaust line 15. By operating the gas exhaust unit 16, the chamber 1 is exhausted and a pressure in the chamber 1 can be decreased to a predetermined level. Formed at a sidewall of the chamber 1 are a loading/unloading port 17 for loading/unloading the wafer W and a gate valve 18 for opening/closing the loading/unloading port 17.

The plasma processing apparatus 100 includes: a first gas shower unit 21 for injecting a predetermined gas into the chamber 1 from the ceiling wall 10a of the chamber 1; a second gas shower unit 22 for introducing a gas from a position between the ceiling wall 10a of the chamber 1 and the susceptor 11; and a third gas shower unit 23 for introducing a gas from a position between the ceiling wall 10a of the chamber 1 and the susceptor 11, which is located at an outer side of the second gas shower unit 22. The first to the third gas shower unit 21 to 23 will be described in detail later.

A first gas containing an excitation gas, e.g., Ar gas, or a gas to be dissociated with high energy, among processing gases, is supplied from a first gas supply unit 81 to the first gas shower unit 21 through a line 83. The first gas shower unit 21 injects the first gas into the chamber 1. A second gas that is a gas whose excessive dissociation needs to be prevented among the processing gases is supplied from a second gas supply unit 82 to the second and the third gas shower unit 22 and 23 through lines 84 and 85. The second and the third gas shower unit 22 and 23 inject the second gas into the chamber 1.

The microwave plasma source 2 includes a microwave output unit 30 for distributing and outputting microwaves to a plurality of channels, and a microwave transmission unit for transmitting the microwaves outputted from the microwave output unit 30.

As shown in FIG. 2, the microwave output unit 30 has a microwave power supply 31, a microwave oscillator 32, an amplifier 33 and a distributor 34.

The microwave power supply 31 supplies a power to the microwave oscillator 32. The microwave oscillator 32 oscillates the microwave at a predetermined frequency (e.g., 860 MHz) by using PLL (phase-locked loop), for example. The amplifier 33 amplifies the oscillated microwave. The distributor 34 distributes the microwave amplified by the amplifier 33 while matching an impedance between an input side and an output side so that loss of the microwave can be minimized. The frequency of the microwave is not limited to 860 MHz and may be 915 MHz, 700 MHz, 3 GHz, or the like.

The microwave transmission unit 40 has a plurality of amplifier units 41 and a plurality of microwave radiation mechanisms 42 corresponding to the amplifier units 41. For example, six microwave radiation mechanisms 42 spaced apart from each other at a regular interval are arranged at a peripheral portion of the ceiling wall 10a along a circumferential direction and one microwave radiation mechanism 42 is provided at a central portion of the ceiling wall 10a, as can be seen from FIG. 3. In this example, the microwave radiation mechanisms 42 are arranged such that a distance between the central microwave radiation mechanism 42 and each of the peripheral microwave radiation mechanisms 42 becomes the same as a distance between the peripheral microwave radiation mechanisms 42.

The amplifier units 41 of the microwave transmission unit 40 guide the microwaves distributed by the distributor 34 to the respective microwave radiation mechanisms 42. Each of the amplifier units 41 includes a phase shifter 43, a variable gain amplifier 44, a main amplifier 45 and an isolator 46.

The phase shifter 43 is configured to shift the phase of the microwave, and the radiation characteristics can be modulated by controlling the phase shifter 43. For example, the directivity can be controlled by adjusting the phase in each of the microwave radiation mechanisms 42 to thereby change the plasma distribution. Further, circularly polarized waves can be obtained by shifting the phase by 90° between adjacent microwave radiation mechanisms 42. The phase shifter 43 can be used to control delay characteristics between components in the amplifier and perform spatial combination in a tuner to be described later. However, the phase shifter 43 may not be provided when it is unnecessary to modulate the radiation characteristics or to control the delay characteristics between the components in the amplifier.

The variable gain amplifier 44 controls a power level of the microwave to be inputted to the main amplifier 45 and adjusts a plasma intensity. By controlling the variable gain amplifier 44 for each of the amplifier units 41, it is possible to adjust the distribution of the generated plasma.

The main amplifier 45 constituting a solid state amplifier may have, e.g., an input matching circuit, a semiconductor amplifying device, an output matching circuit, and a high Q resonant circuit.

The isolator 46 separates a reflected microwave reflected by a planar antenna to be described later toward the main amplifier 45. The isolator 46 has a circulator and a dummy load (coaxial terminator). The circulator guides the reflected microwave to the dummy load, and the dummy load converts the reflected microwave guided by the circulator into heat.

The microwave radiation mechanism 42 has a function of radiating the microwave outputted from the amplifier unit 41 into the chamber 1 and a function of matching an impedance.

As shown in FIG. 4, the microwave radiation mechanism 42 includes: a coaxial tube 51 having a cylindrical outer conductor 52, an inner conductor 53 coaxially arranged within the outer conductor 52, and a microwave transmission path provided therebetween; a power supply antenna (not shown) for supplying the microwave amplified by the amplifier unit 41 to the coaxial tube 51 through a coaxial cable 55; a tuner 54 for matching an impedance of a load to a characteristic impedance of the microwave power supply 31; and an antenna unit 56 for radiating the microwave from the coaxial tube 51 into the chamber 1.

By radiating from the power supply antenna the microwave supplied from a side of an upper end portion of the outer conductor 52 through the coaxial cable 55, a microwave power is supplied to the microwave transmission path between the outer conductor 52 and the inner conductor 53 and then propagates toward the antenna unit 56.

The antenna unit 56 is provided at a lower end portion of the coaxial tube 51 and fitted to a metallic part of the ceiling wall 10a of the chamber 1. The antenna unit 56 includes a planar antenna 61 connected to a lower end portion of the inner conductor 53, a wave retardation member 62 provided on a top surface of the planar antenna 61, and a dielectric window 63 provided at a bottom surface of the planar antenna 61.

The planar antenna 61 has slots 61a penetrating therethrough in a thickness direction. The slots 61a have a shape that allows the microwaves to be effectively radiated. A dielectric material may be inserted in the slots 61a.

The wave retardation member 62 is made of a dielectric material having a dielectric constant greater than vacuum. The wave retardation member 62 has a function of shortening the wavelength of the microwave to thereby reduce the size of the antenna. The phase of the microwave can be adjusted by the thickness of the wave retardation member 62. By adjusting the thickness of the wave retardation member 62 such that an antinode of the standing wave is formed at a contact portion of the planar antenna 61, the radiation energy of the microwave can be maximized.

The dielectric window 63 is made of the same dielectric material as that of the wave retardation member 62 and fitted to the metallic part of the ceiling wall 10a. A bottom surface of the dielectric window 63 is exposed to an inner space of the chamber 1. The dielectric window 63 has a shape that allows the microwave to be radiated effectively in a TE mode. The microwave transmitting through the dielectric window 63 generates a surface wave plasma directly below the dielectric window 63.

Hereinafter, a dielectric window 63 positioned at the center will be referred to as a central dielectric window 63 and dielectric windows 63 arranged at a regular interval on the same circumference around the central dielectric window 63 will be referred to as peripheral dielectric windows 63.

The wave retardation member 62 and the dielectric window 63 may be made of, e.g., quartz, ceramic, a fluorine-based resin such as polytetrafluoroethylene or the like, or a polyimide-based resin.

The tuner 54 forms a slug tuner. The tuner 54 includes two slugs 71a and 71b positioned close to a base end side (upper end side) of the coaxial tube 51 compared to the antenna unit 56, an actuator 72 for individually driving the two slugs, and a tuner controller 73 for controlling the actuator 72.

The slugs 71a and 71b are formed in an annular plate shape and made of a dielectric material such as ceramic or the like. The slugs 71a and 71b are provided between the outer conductor 52 and the inner conductor 53 of the coaxial tube 51. The actuator 72 individually drives the slugs 71a and 71b by rotating, e.g., two screws provided inside the inner conductor 53 and respectively screw-coupled to the slugs 71a and 71b. Further, the actuator 72 moves the slugs 71a and 71b up and down based on an instruction from the tuner controller 73. When only one of the two slugs is moved, a trajectory of the impedance passes through the origin of the smith chart. When both of the two slugs are moved at the same time, only the phase of the impedance is rotated. The tuner controller 73 performs impedance matching by controlling the positions of the slugs 71a and 71b such that an impedance of a terminal becomes 50Ω.

The main amplifier 45, the tuner 54, and the planar antenna 61 are arranged close to one another. The tuner 54 and the planar antenna 61 form a lumped constant circuit and serve as a resonator. An impedance mismatching occurs at a connection portion of the planar antenna 61. Since, however, the plasma load can be directly tuned by the tuner 54, the plasma and the like can be tuned with high accuracy. Accordingly, the effect of the reflection in the planar antenna 61 can be eliminated.

Next, a gas introduction mechanism in the plasma processing apparatus 100 will be described with reference to FIGS. 1 and 5 to 7.

Figure 5:
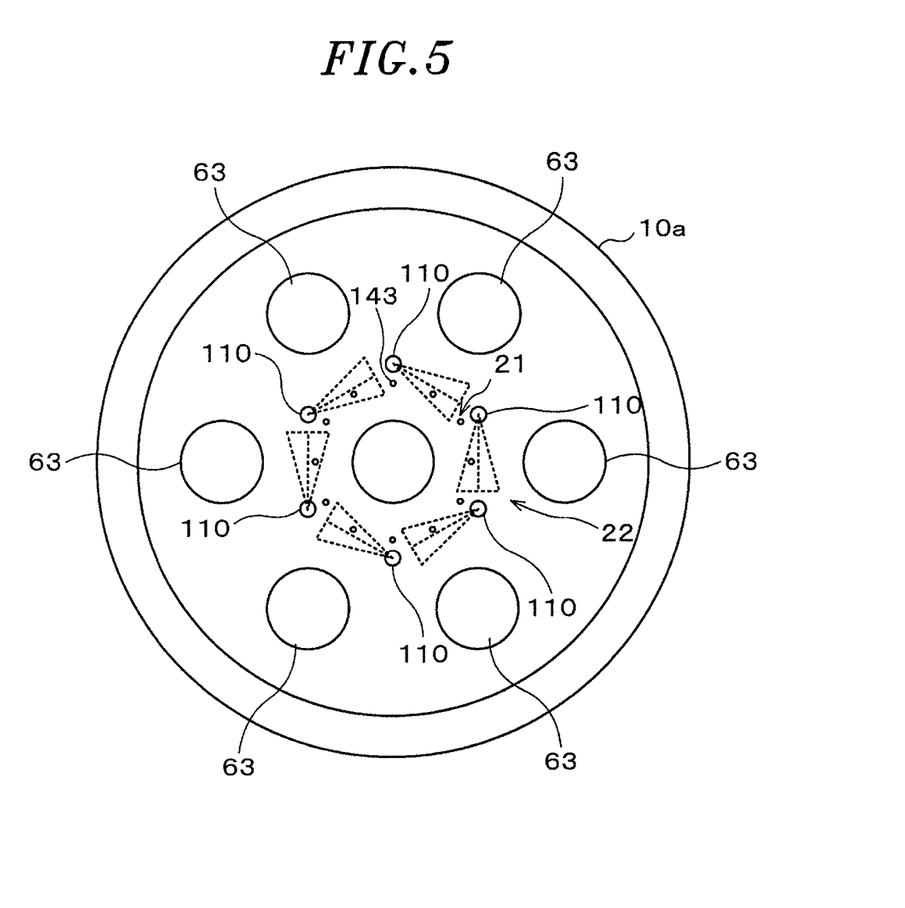
FIG. 5 is a bottom view of a ceiling wall shown in FIG. 1.
Figure 6A:
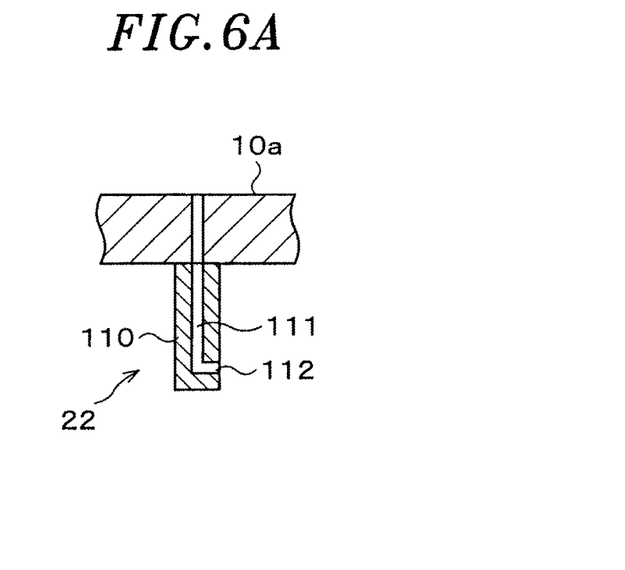
FIGS. 6A and 6B are schematic views for explaining a nozzle forming a second gas shower unit shown in FIG. 1.
Figure 6B:
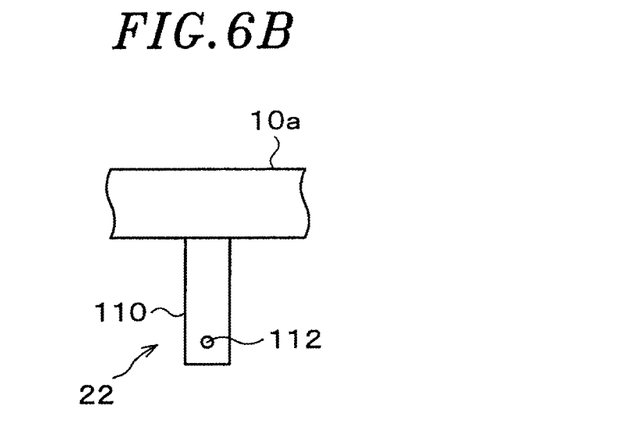
Figure 7:
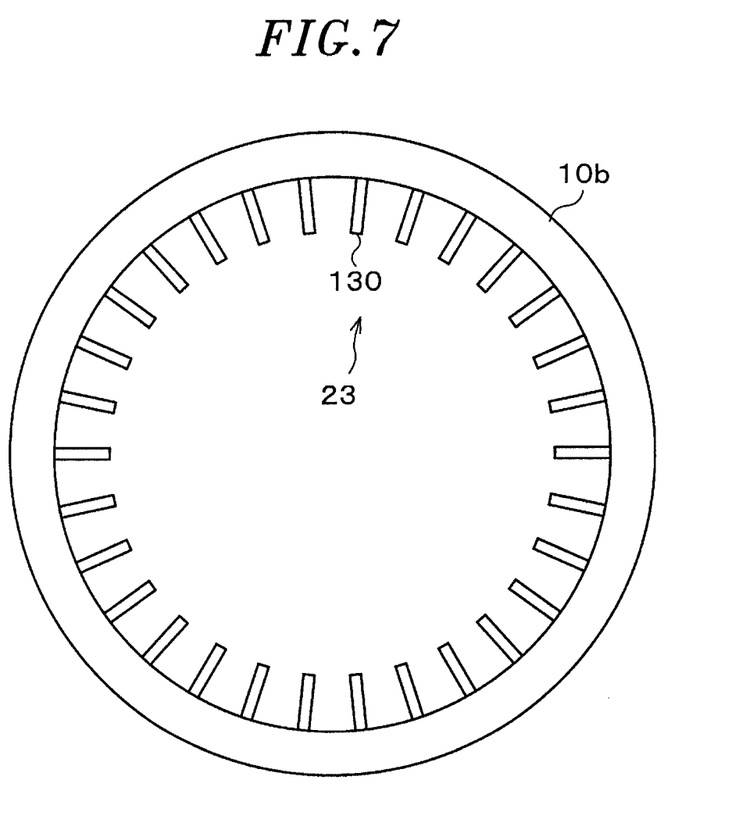
FIG. 7 is a schematic view for explaining nozzles forming a third gas shower unit shown in FIG. 1.

FIG. 5 is a bottom view of the ceiling wall 10a. FIGS. 6A and 6B are schematic views for explaining a nozzle forming the second gas shower unit 22. FIG. 6A is a cross sectional view of the nozzle and FIG. 6B is a side view of the nozzle. FIG. 7 is a schematic view for explaining nozzles forming the third gas shower unit 23. FIG. 7 is a top view of the sidewall 10b where the third gas shower unit 23 is provided.

As shown in FIGS. 1 and 5, the plasma processing apparatus 100 includes the first gas shower unit 21, the second gas shower unit 22, and the third gas shower unit 23. The first gas shower unit 21 injects a gas from the ceiling wall 10a of the chamber 1. The second gas shower unit 22 injects a gas from a predetermined height position between the ceiling wall 10a and the susceptor 11. The third gas shower unit 23 injects a gas from a position located the outer side of the second gas shower unit 22.

The first gas shower unit 21 includes: a gas diffusion space 141 formed in an annular shape at the metallic part of the ceiling wall 10a; a gas inlet hole 142 provided above the gas diffusion space 141 to communicate with the gas diffusion space 141; and a plurality of gas discharge holes 143 extending from the gas diffusion space 141 to the chamber 1. The line 83 is connected to the gas inlet hole 142. Therefore, the first gas containing the excitation gas, e.g., Ar gas, or a gas to be dissociated with high energy, among the processing gases, which is supplied from the first gas supply unit 81 through the line 83 is supplied from the ceiling wall 10a of the chamber 1. The number of the gas discharge holes 143 is, e.g., twelve. At an inner side of the second gas shower unit 22, twelve nozzles are arranged at a regular interval on the same circumference around the center of the ceiling wall 10a when seen from the top.

The second gas shower unit 22 includes nozzles 110 extending from the ceiling wall 10a toward the susceptor 11. The nozzles 110 preferably extend from the ceiling wall 10a in a vertical direction. The number of the nozzles 110 is, e.g., six. The six nozzles 110 are arranged at portions of the metallic part of the ceiling wall 10a where the first gas shower unit 21 is not disposed. Further, the nozzles 110 are arranged at a regular interval on the same circumference around the center of the ceiling wall 10a when seen from the top. At an inner side of the peripheral dielectric windows 63, each of the nozzles 110 is provided at a portion where a distance to the adjacent peripheral dielectric window 63 is the same as a distance to the central dielectric window 63, for example.

The nozzles 110 discharge the second gas whose excessive dissociation needs to be suppressed, among processing gases, such as $SiH_4$ and the like to a region of the chamber 1 where the electron temperature of the plasma is relatively low. The nozzles 110 are preferably made of a metal, especially a metal having high conductivity, e.g., aluminum. The nozzles 110 may be made of a pure base material. However, the nozzles 110 may be subjected to spraying of ceramic such as $Y_2O_3$ or the like, alumite treatment (anodic oxidation), blast processing or the like in order to control contamination. The nozzles 110 may be made of a dielectric material as long as abnormal discharge does not occur.

As shown in FIG. 6A, a channel 111, which has an L-shaped cross section and serves as a gas passage, is formed in the nozzle 110. As shown in FIG. 6B, a gas discharge hole 112 is formed at a side surface of a leading end portion of each of the nozzles 110. The gas discharge hole 112 discharges a gas from the channel 111 to a nozzle 110 adjacent thereto. In other words, the gas discharge hole 112 is directed toward a nozzle 110 adjacent to the nozzle 110 having the corresponding gas discharge hole 112. The gas is discharged from the gas discharge holes 112 with a certain degree of diffusion. The gas discharge hole 112 may extend from the channel 111 while being inclined by a certain angle with respect to the horizontal direction.

In this example, based on a circle where the six nozzles 110 are arranged, the gas is discharged from the nozzles 110 along the same circumference of the circle. Further, in this example, the gas is discharged from the gas discharge holes 112 toward spaces between the central dielectric window 63 and the peripheral dielectric windows 63. Although the gas is discharged from each of the nozzles 110 toward one of two nozzles 110 adjacent thereto in this example, the gas may be discharged toward both of the two nozzles 110 adjacent thereto. In other words, the gas may be discharged in two directions.

The gas discharge hole 112 discharges a gas from a predetermined position between the ceiling wall 10a and the susceptor 11. In other words, the gas discharge hole 112 is formed at the nozzle 110 while being spaced apart from the ceiling wall 10a by a predetermined distance. The predetermined distance is optimized such that a desired dissociation degree of the discharged gas is obtained and appropriately set within a range of 20 to 200 mm from the inner surface of the ceiling wall 10a. In the case of supplying $SiH_4$ gas as the processing gas, the predetermined distance is preferably within a range of 30 to 150 mm and set to, e.g., 80 mm.

A diameter of the gas discharge holes 112 is preferably 0.5 mm or less, e.g., 0.1 mm, 0.3 mm or 0.5 mm, in order to prevent intrusion of plasma. The diameter of the gas discharge holes 112 may be further reduced to, e.g., about 5 μm that is considered as a machining limit.

In the above description, the gas discharge hole 112 is directed toward another nozzle 110 adjacent to the nozzle 110 having the corresponding gas discharge hole 112. In that case, the expression "directed toward the nozzle 110 adjacent thereto" indicates that the central axis of the gas discharge hole 112 may intersect with the central axis of the nozzle 110 adjacent thereto. However, the central axes thereof do not necessarily intersect with each other as long as desired gas uniformity can be ensured.

In the above description, the number of the nozzles 110 is six. However, the number of the nozzles 110 is not limited thereto and may be optimized depending on desired gas uniformity, gas flow rate, plasma uniformity, the number of the peripheral dielectric windows 63 and the like. For example, the number of the nozzles 110 is set within a range from 4 to 32 and preferably within a range from 6 to 16.

As the number of the nozzles 110 is increased and as a gap between the nozzles 110 is decreased, the uniformity of the plasma tends to deteriorate. Therefore, it is preferable to set the number of the nozzles 110 and the gap between the nozzles 110 such that desired plasma uniformity can be ensured. As long as the desired plasma uniformity is ensured, it is possible to reduce the gap between the nozzles 110 and increase the number of the nozzles 110 in order to intentionally shield the plasma. The gap between the nozzles 110 is preferably set such that an inscribed circle has a diameter of φ30 mm or more, e.g., φ80 mm.

As described above, the nozzles 110 are arranged on the same circumference. In order to uniformly introduce the processing gas, it is preferable to optimize the diameter of the nozzles 110 depending on types of processing gases, a pressure, and a shape of the chamber. The diameter of the circumference on which the nozzles 110 are arranged may vary within a range from 30 mm to 505 mm. The diameter of the circumference on which the nozzles 110 are arranged is preferably smaller than the diameter of the wafer. For example, when a SiN film is formed by plasma CVD, $SiH_4$ gas is discharged from the second gas shower unit 22. In that case, the diameter of the nozzles 110 is set to about 80 mm to 320 mm, e.g., 160 mm.

The horizontal cross section of the nozzle 110 has a circular shape, for example. Although the cross sectional shape of the nozzles 110 is not limited thereto, the nozzles 110 preferably have a circular cross section in view of suppression of plasma shielding. It is preferable that a corner portion of the nozzles 110 is rounded to have a curvature radius R in order to reduce concentration of an electric field at the corner portion.

A gas is supplied to the channel 111 of the nozzle 110 through a channel in the ceiling wall 10a which is connected to the line 84. Therefore, the second gas whose excessive dissociation needs to be prevented is supplied from the second gas supply unit 82 through the line 84 and discharged from the gas discharge holes 112.

The nozzles 110 may have a cooling function.

In view of the plasma uniformity, it is preferable that the nozzles 110 have a small diameter. However, a diameter greater than a certain level is required to provide a space for gas supply and ensure thermal conductivity. The diameter is preferably within a range from φ5 mm to φ20 mm, e.g., φ15 mm.

The number of connection locations between the nozzles 110 and the ceiling wall 10a is preferably the same as the number of locations corresponding to nodes of the electric field of the surface wave generated by the plasma source 2.

The nozzles 110 and the ceiling wall 10a of the chamber 1 may be formed as one unit or separate units. When the nozzles 110 and the ceiling wall 10a of the chamber 1 are formed as separate units, it is required to reliably couple the nozzles 110 to the ceiling wall 10a to thereby have the electrically same potential and reliably prevent gas leakage.

The third gas shower unit 23 discharges the second gas, which is a processing gas whose excessive dissociation needs to be suppressed, to an outer peripheral portion of the wafer W. As shown in FIGS. 1 and 7, the third gas shower unit 23 has thirty nozzles 130 extending from the sidewall 10b toward the center of the chamber 1 when seen from the top. The nozzles 130 preferably extend from the sidewall 10b in a horizontal direction. The nozzles 130 are arranged at the annular sidewall 10b at a regular interval. In other words, the thirty nozzles 130 are annularly arranged on the same plane at a regular interval. The nozzles 130 are formed at regions that are not overlapped with the wafer W when seen from the top.

Each of the nozzles 130 has a gas discharge hole 134 for discharging a gas toward the center of the chamber 1 when seen from the top. The gas discharge hole 134 may extend from a gas diffusion space 131 to be described later while being inclined by a certain angle with respect to the horizontal direction. Or, the gas discharge hole 134 may be extended in the horizontal direction.

The third gas shower unit 23 includes: a gas diffusion space 131 formed in an annular shape in the sidewall 10b, and a gas inlet hole 132 formed at an outer side of the gas diffusion space 131 to communicate with the gas diffusion space 131; and a channel 133 extending from the gas diffusion space 131 to the nozzle 130. The line 85 is connected to the gas inlet hole 132. Therefore, the second gas supplied from the second gas supply unit 82 through the line 85 reaches the nozzles 130 through the sidewall 10b having the gas inlet hole 132 and the like and is discharged from the gas discharge holes 134 toward the center of the chamber 1 when seen from the top.

The material of the nozzles 130 of the third gas shower unit 23, the diameter of the gas discharge holes 134 and the like are appropriately set based on those in the second gas shower unit 22.

The gas discharge holes 134 of the third gas shower unit 23 may be disposed at the height position at which the excessive dissociation of the gas discharged through the gas discharge holes 134 can be prevented. The height position of the gas discharge holes 134 may not be the same as that of the gas discharge holes 112 of the second gas shower unit 22.

The number of the nozzles 130 is optimized depending on desired gas uniformity, gas flow rate, plasma uniformity and the like. For example, the number of the nozzles 110 is set within a range from 4 to 200 and preferably within a range from 20 to 50.

As the number of the nozzles 130 is increased and as a gap between the nozzles 130 is decreased, the uniformity of the plasma tends to deteriorate. Therefore, it is preferable to set the number of the nozzles 130 and the gap between the nozzles 130 such that desired plasma uniformity can be ensured. As long as the desired plasma uniformity is ensured, it is possible to reduce the gap between the nozzles 130 and increase the number of the nozzles 130 in order to intentionally shield the plasma. The gap between the nozzles 130 is preferably set such that a distance between root portions of the adjacent nozzles 130 is 30 mm or more, e.g., 80 mm.

Hereinafter, an operation of the plasma processing apparatus 100 configured as described above will be described.

First, the wafer W is loaded into the chamber 1 and mounted on the susceptor 11. The inside of the chamber 1 is exhausted by the gas exhaust unit 16, and a pressure in the chamber 1 is controlled to a predetermined pressure. Then, the first gas containing an excitation gas, e.g., Ar gas, for plasma generation or a gas that requires high energy for dissociation, among processing gases, is supplied from the first gas supply unit 81 to the first gas shower unit 21 formed at the ceiling wall 10a through the line 83. These gases are injected from the first gas shower unit 21 into the chamber 1.

The microwaves transmitted from the microwave output unit 30 of the microwave plasma source 2 through the amplifier units 41 of the microwave transmission unit 40 and the transmission paths of the microwave radiation mechanisms 42 are radiated into the chamber 1 through the wave retardation member 62 of the antenna unit 56 fitted to the ceiling wall 10a, the slots 61a of the planar antenna 61, and the dielectric window 63. At this time, the impedance is automatically matched by the slugs 71a and 72b of the tuner 54 and the microwaves are supplied in a state where the power reflection substantially does not occur. The microwaves radiated from the microwave radiation mechanisms 42 are spatially combined, and a surface wave plasma is generated near the surface of the dielectric window 63 of the ceiling wall 10a by the microwave electric field. At this time, the electron temperature of the surface wave plasma is high near the ceiling wall 10a and the first gas is dissociated with high energy.

The second gas that is a gas whose excessive dissociation needs to be prevented, among the processing gases, is supplied from the second gas supply unit 82 to the second and the third gas shower unit 22 and 23 through the lines 84 and 85 and then is injected from the second and the third gas shower unit 22 and 23 into the chamber 1. The second gas injected from the second and the third gas shower unit 22 and 23 is excited by the plasma of the first gas. At this time, the arrangement positions of the gas discharge holes 112 of the second gas shower unit 22 and the gas discharge holes 134 of the third gas shower unit 23 are positions spaced from the surface of the ceiling wall 10a, from which the microwaves are radiated, where the energy is lower. Therefore, the second gas is excited in a state where the excessive dissociation is suppressed. The wafer W is subjected to plasma processing by the plasmas of the first and the second gas.

For example, when a SiN film is formed by plasma CVD, Ar gas for excitation and $N_2$ gas or $NH_3$ gas that is a nitriding gas requiring high dissociation energy is supplied as the first gas from the first gas supply unit 81 to the first gas shower unit 21 and then injected into the chamber 1. As a consequence, a plasma is generated. $SiH_4$ gas, whose excessive dissociation needs to be prevented, is supplied as the second gas from the second gas supply unit 82 to the second and the third gas shower unit 22 and 23 and then injected into the chamber 1. Thus, the second gas is excited in a state where the excessive dissociation is suppressed.

Accordingly, the dissociation of the gas can be controlled depending on properties of gases by using a difference in an electron temperature depending on positions in the chamber 1. Therefore, it is possible to suppress generation of gaseous reaction particles due to the excessive dissociation of the second gas that is a processing gas such as $SiH_4$ gas or the like which is easily excessively dissociated or suppress clog of the nozzle (gas discharge holes).

The second gas shower unit 22 discharges a gas through the gas discharge holes 112 arranged on the same circumference. In other words, the gas is discharged in a tangential direction of the circumference. The influence of the nozzle 110 on the uniformity of the plasma is limited. Therefore, by appropriately controlling the number of the nozzles 110, desired plasma uniformity can be obtained. Especially, in the plasma processing apparatus 100t, the nozzles 110 vertically extend from the ceiling wall 10a and, thus, the influence of the nozzles 110 on the uniformity of the plasma can be reduced. Further, by optimizing the number of the nozzles 110 while maintaining an outer diameter of the circumference on which the nozzles 110 are arranged, the desired gas introduction uniformity (uniformity in the circumferential direction) can be obtained. Accordingly, the processing gas introduction uniformity can be obtained while maintaining the uniformity of the plasma.

In other words, in the plasma processing apparatus 100, the processing gas can be dissociated to a state suitable for properties of gases and, also, both of the processing gas introduction uniformity and the desired plasma uniformity can be obtained.

In the plasma processing apparatus 100, the processing gas is discharged from a member provided to the ceiling wall 10a, i.e., the nozzles 110. Therefore, the structure can be simplified and, also, a unit for cooling a member for discharging the processing gas, i.e., the nozzles 110 or the like can be simplified.

By providing the third gas shower unit 23 at the outer side of the second gas shower unit 22 and discharging the second gas through the nozzles 130 of the third gas shower unit 23 which are annularly arranged at a regular interval, the uniformity of the second gas can be further improved.

In that case, the nozzles 130 protrude from the sidewall 10b of the chamber 1. Since, however, the nozzles 130 are provided at the outer side of the wafer W when seen from the top, the uniformity of the plasma is hardly affected by the nozzles 130.

In the plasma processing apparatus 100, the ceiling wall 10a has a structure in which the dielectric windows 63 of the microwave radiation mechanisms 42 are fitted to the metallic main body. Therefore, it is easy to couple the nozzles 110 of the second gas shower unit 22 to the metallic part of the ceiling wall 10a by welding or the like. It is also easy to form the metallic part of the ceiling wall 10a and the nozzles 110 as one unit.

By spatially combining the plasma by using the microwave radiation mechanisms 42, phases or intensities of the microwaves introduced from the microwave radiation mechanisms 42 can be individually controlled. Accordingly, the plasma distribution can be relatively easily controlled, which makes it possible to perform plasma processing with high controllability.

Second Embodiment

Figure 8:
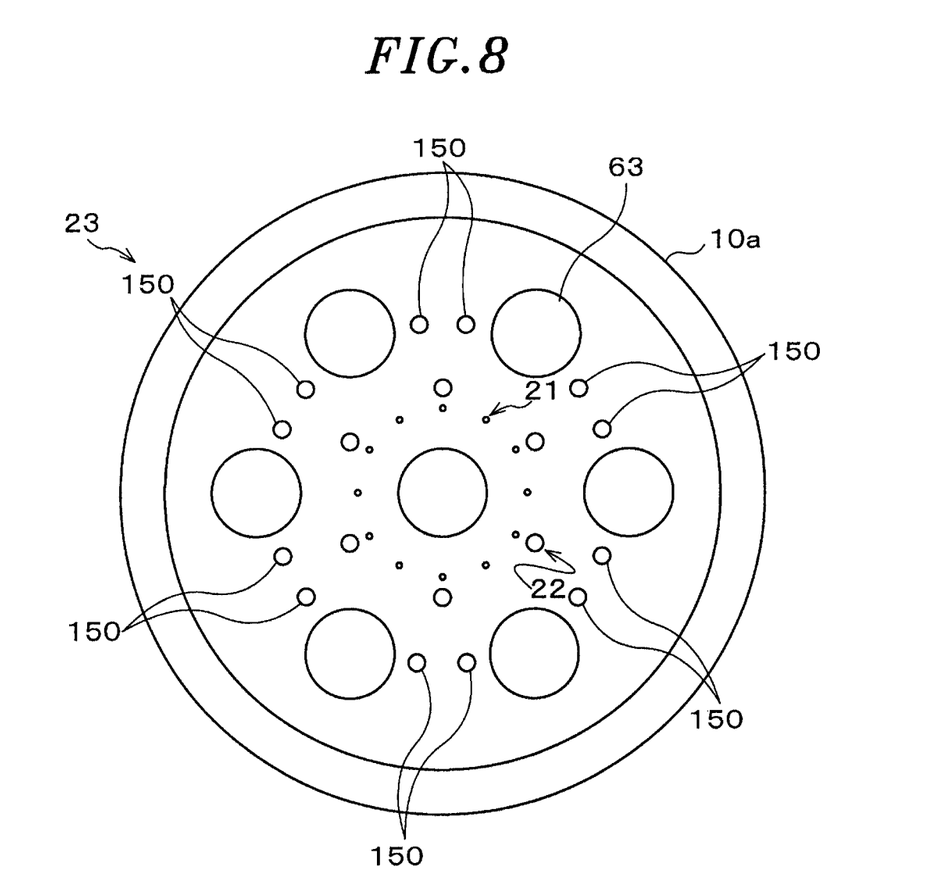
FIG. 8 is a view for explaining a third gas shower unit of a plasma processing apparatus according to a second embodiment.

FIG. 8 explains a plasma processing apparatus according to a second embodiment and shows a bottom surface of a ceiling wall in the second embodiment. Hereinafter, only differences between the first embodiment and the second embodiment will be described and redundant description on the same features such as the second gas supply mechanism and the like will be omitted.

In the present embodiment, as shown in FIG. 8, the third gas shower unit 23 for discharging the second gas whose excessive dissociation needs to be suppressed to an outer peripheral portion of the wafer W has nozzles 150 extending from the ceiling wall 10a toward the susceptor 11. The number of the nozzles 150 is, e.g., twelve. The twelve nozzles 150 are provided at portions of the metallic part of the ceiling wall 10a which are located at an outer side of the first gas shower unit 21. More specifically, at the outer side of the second gas shower unit 22, two nozzles 150 are provided between the adjacent dielectric windows 63 of the microwave radiation mechanisms 42. Further, the nozzles 150 are arranged on the same circumference around the center of the ceiling wall 10a when seen from the top. In other words, the plasma processing apparatus of the present embodiment includes a plurality of concentrically arranged nozzle groups for discharging the second gas.

Each of the nozzles 150 of the third gas shower unit 23 has a gas discharge hole (not shown). The second gas may be discharged through the gas discharge hole toward the center of the chamber 1 when seen from the top. Or, the second gas may be discharged through the gas discharge hole toward a nozzle adjacent thereto as in the case of the nozzles 110 of the first embodiment. The gas discharge direction is optimized depending on desired gas uniformity, gas flow rate, plasma uniformity and the like.

In the present embodiment, the uniformity of the second gas can be further improved.

The gas discharge holes of the nozzles 150 may be disposed at the height position at which the excessive dissociation of the gas discharged through the gas discharge holes can be prevented. The height position of the gas discharge holes of the nozzles 150 may not be the same as that of the gas discharge holes of the second gas shower unit 22.

In the above description, the number of the nozzles 150 is twelve. However, the number of the nozzles 150 is not limited thereto. The number of the nozzles 150 is preferably greater than the number of the nozzles 110 of the second gas shower unit 22 and optimized depending on desired gas uniformity, gas flow rate, plasma uniformity and the like. The number of the nozzles 150 is set within a range of, e.g., 6 to 64 and preferably within a range of 12 to 32.

Other Applications

In the plasma processing apparatus of the above embodiments, the nozzles of the second gas shower unit may discharge the second gas upward or downward at a predetermined angle with respect to the horizontal direction.

Further, in the plasma processing apparatus of the above embodiments, the nozzles of the second gas shower unit may include first nozzles for discharging the second gas downward at a predetermined angle with respect to the horizontal direction and second nozzles for discharging the second gas upward at a preset angle with respect to the horizontal direction, the first nozzles and the second nozzles being alternately provided.

In the above embodiments, the plasma CVD for forming a SiN film has been described as an example of the plasma processing. However, the present disclosure is not limited thereto and can be applied to plasma processing using a processing gas containing a gas whose excessive dissociation needs to be prevented and a gas to be dissociated with high energy. Further, the present disclosure can be applied to film formation of an SiCN film, a CF film, a BN film, an $SiO_2$ film, an SiON film or the like, or to etching other than the film formation.

In the above example, in order to form an SiN film, Ar gas and a nitriding gas ($N_2$ gas or $NH_3$ gas) are introduced as the first gas and $SiH_4$ gas is introduced as the second gas. However, in the embodiments of the present disclosure, only $N_2$ or $O_2$ may be introduced as the first gas and $SiH_4$ gas and $H_2$ gas may be introduced as the second gas. Or, $C_2H_6$ gas may be introduced as the second gas in addition to $SiH_4$ gas and $H_2$ gas. Or, $SiH_4$ gas and $C_2H_6$ gas may be introduced as the second gas.

The target object is not limited to a semiconductor wafer and may be another substrate such as an FPD (Flat Panel Display) substrate represented as a substrate for use in LCD (Liquid Crystal Display), a ceramic substrate or the like.

The present disclosure is effectively used for a technique for performing plasma processing on a target object.

While the disclosure has been shown and described with respect to the embodiments, it will be understood by those skilled in the art that various changes and modifications may be made without departing from the scope of the disclosure as defined in the following claims.

What is claimed is:

1. A plasma processing apparatus comprising:
   a chamber;
   a mounting table configured to mount thereon a target object in the chamber;
   a plasma source configured to introduce microwaves into the chamber through a ceiling wall of the chamber and generate a surface wave plasma in the chamber;
   a first gas introduction unit configured to introduce a first gas into the chamber from the ceiling wall; and
   a second gas introduction unit configured to introduce a second gas into the chamber from a predetermined height position between the ceiling wall and the mounting table,
   wherein the second gas introduction unit has a plurality of nozzles extending from the ceiling wall toward the mounting table and arranged on a same circumference at a regular interval, and
   wherein each of the nozzles discharges the second gas toward a nozzle adjacent thereto.

2. The plasma processing apparatus of claim 1, wherein the ceiling wall has a dielectric window through which the microwave transmits and a metallic part to which the dielectric window is fitted,
   the first gas introduction unit is disposed at the metallic part, and
   the nozzles are provided at portions of the metallic part where the first gas introduction unit is not disposed.

3. The plasma processing apparatus of claim 2, wherein the dielectric window includes a central dielectric window provided at a center of the ceiling wall and peripheral dielectric windows arranged at a regular interval on a same circumference around the central dielectric window, and
   each of the nozzles discharges the second gas to a space between the central dielectric window and the peripheral dielectric window corresponding thereto.

4. The plasma processing apparatus of claim 1, wherein each of the nozzles discharges the second gas downward or upward at a predetermined angle with respect to a horizontal direction.

5. The plasma processing apparatus of claim 1, wherein the nozzles include first nozzles configured to discharge the second gas downward at a predetermined angle with respect to the horizontal direction and second nozzles configured to discharge the second gas upward at a preset angle with respect to the horizontal direction, the first nozzles and the second nozzles being alternately provided.

6. The plasma processing apparatus of claim 1, further comprising:
   a third gas introduction unit provided at an outer side of the second gas introduction unit and configured to introduce the second gas into the chamber,
   wherein the third gas introduction unit has a plurality of nozzles arranged at a regular interval on a same circumference.

* * * * *